(12) United States Patent
Kim et al.

(10) Patent No.: US 8,499,187 B2
(45) Date of Patent: Jul. 30, 2013

(54) METHODS AND APPARATUSES FOR MASTER-SLAVE DETECTION

(75) Inventors: Kang-Yong Kim, Boise, ID (US); Jacob Robert Anderson, Meridian, ID (US); Huy Vo, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 162 days.

(21) Appl. No.: 13/209,234

(22) Filed: Aug. 12, 2011

(65) Prior Publication Data

US 2013/0042138 A1 Feb. 14, 2013

(51) Int. Cl.
*G06F 1/14* (2006.01)
(52) U.S. Cl.
USPC .......................................... 713/502; 711/170
(58) Field of Classification Search
USPC .......................................... 711/170; 713/502
See application file for complete search history.

(56) References Cited

U.S. PATENT DOCUMENTS

| 5,818,107 | A | 10/1998 | Pierson et al. |
| 6,404,660 | B1 | 6/2002 | Gamini et al. |
| 6,914,259 | B2 | 7/2005 | Sakiyama et al. |
| 7,382,844 | B2 * | 6/2008 | Hwang et al. ................. 375/354 |
| 2010/0020583 | A1 | 1/2010 | Kang et al. |
| 2012/0007624 | A1 * | 1/2012 | Byeon et al. ............. 324/750.15 |

* cited by examiner

*Primary Examiner* — Albert Wang
(74) *Attorney, Agent, or Firm* — Dorsey & Whitney LLP

(57) ABSTRACT

Apparatuses, master-slave detect circuits, memories, and methods are disclosed. One such method includes performing a master detect phase during which a memory unit in a memory group is determined to be a master memory unit, determining at each memory unit its location relative to other memory units, and determining at each memory unit its location in the memory group based on a total number of slave memory units and its location relative to other memory units.

26 Claims, 10 Drawing Sheets

METHODS AND APPARATUSES FOR MASTER-SLAVE DETECTION

TECHNICAL FIELD

Embodiments of the present invention relate generally to semiconductor memory and, more specifically, in one or more illustrated embodiments, to detecting the relative locations of master and slave memory units during memory initialization.

BACKGROUND OF THE INVENTION

Semiconductor memory units commonly include addressable memory arrays and memory circuitry, including input/output pads, sense amplifiers, decoders, and control logic are frequently formed on semiconductor material. In an effort to maximize memory storage density, memory units are often stacked into multi-chip packages ("MCPs"). Having several memory units stacked into a single package increases the storage space and reduces the overall area used by the MCP, for example, on a memory module. In some memory MCPs, one of the memory units (i.e., a "master") receives external signals and can interface with the rest of the memory units (i.e., "slave" memories) in the MCP. In routing commands to the correct memory unit of the MCP, identifying the relative location of the memory units may be necessary.

As a result, memory unit designs utilize a variety of techniques in order to determine the relative location for differentiation between each memory unit in an MCP. By determining the relative location of each memory unit, every memory unit in the MCP may be accessed by external signals despite the lack of a direct interface with the memory units of the MCP. For example, one technique used to differentiate memory locations involves manufacturing each memory separately and hard-coding memory location information directly onto the memory unit. Each memory unit then possesses its location information during initialization of the MCP. However, this technique may be costly, in addition to being complicated and inefficient from a manufacturing standpoint. In order to simplify the process, another example technique is to use all identically manufactured memory units in an MCP arranged in a master-slave configuration. The bottom memory unit in a stacked MCP is designated the master memory unit, and each of the other memory units stacked above are designated as slave memories. The master memory unit is the only one which interfaces with both external signals and the slave memory units. The master memory unit is therefore responsible for routing all incoming and outgoing signals to and from the slaves.

The use of identically manufactured memory units in a master-slave configuration adds complexity to routing signals between the master and slaves. For increased complexity, it may be useful to have additional methods to differentiate between master and slave memory units for signal routing, which often comes at increased cost, manufacturing and operational complexity, and timing penalties. Accordingly, an efficient, fast technique for determining relative master-slave location is desirable.

BRIEF DESCRIPTION OF THE DRAWINGS

While the specification concludes with claims particularly pointing out and distinctly claiming the subject matter that is regarded as forming the various embodiments of the present disclosure, it is believed that the embodiments will be better understood from the following description taken in conjunction with the accompanying Figures.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of apparatuses and methods described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1A:
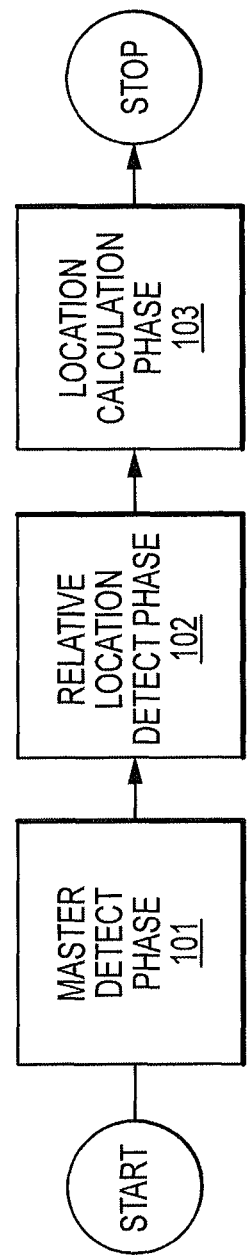
FIG. 1A is a flow diagram of steps performed by a master-slave detect circuit according to an embodiment of the invention.

FIG. 1A illustrates a flow diagram for a master-slave detect circuit 100 according to an embodiment of the present invention. During the initialization, the master-slave detect circuit 100 may perform a master detect phase 101, a relative location detect phase 102, and a memory unit location calculation phase 103 to determine within a memory group a master memory unit and slave memory units. An example memory unit is a memory die, and an example of a memory group is a memory die stack. An example die stack may include vertically ordered stacked dies, with a master memory unit at the base, and slave memory units vertically located (e.g., positioned) on top of the master memory unit. Embodiments of the invention may be implemented for other examples of memory units and memory groups as well, however. During the master detect phase 101 a master memory unit is determined from a group of memory units. The location of the remaining memory units, that is, slave memory units, relative to one another is determined during the relative location detect phase 102. During the memory unit location calculation phase 103 the slave memory units determine their location in the memory group relative to the master memory unit.

Figure 1B:
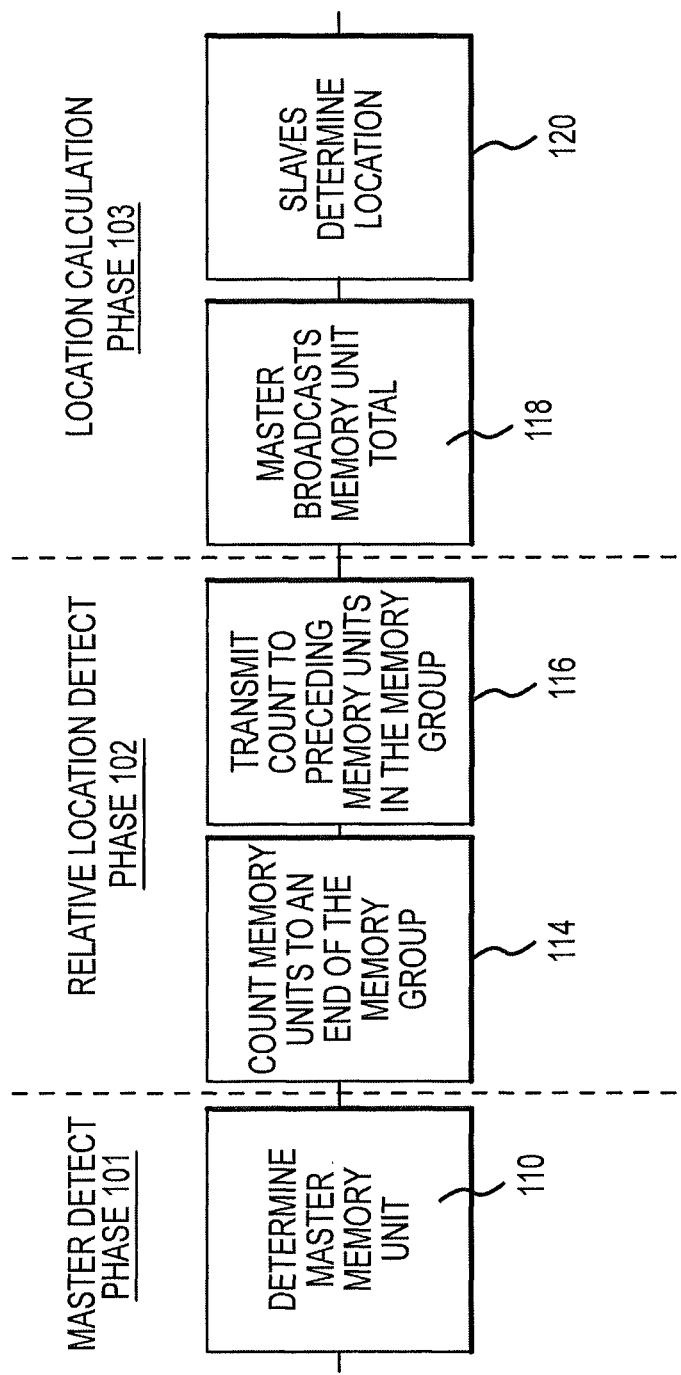
FIG. 1B is a flow diagram for the phases of FIG. 1A according to an embodiment of the invention.

FIG. 1B illustrates an embodiment of a master-slave detect for the master detect phase 101, relative location detect phase 102, and the memory unit location calculation phase 103. The master detect phase 101 begins with step 110, which determines which memory unit in a memory group is the master memory unit and that the remaining memory units are therefore all slave memory units. For example, in some embodiments the master memory unit receives or does not receive a signal that the other memory units receive, thus distinguishing it from the other non-master (i.e., slave) memory units. After detecting when the power-up of all memory units are complete, every memory unit in the group is provided with that information. Upon completion of the power-up, master-slave detect circuit 100 switches to the relative location detect phase 102. Phase 102 includes step 114, in which each memory unit determines its location relative to other memory units by counting a number of succeeding memory units to an end of the memory group. For example, in the case of a memory die stack, each die counts the number of memory dies above itself. In step 116, the number of memory units counted in step 114 is transmitted to a memory unit in the group preceding the counting memory unit. Finally, when the total memory unit count is transmitted to the master memory unit, master-slave detect circuit 100 begins the memory unit location calculation phase 103. At step 118 of phase 103, the total number of slave memory units is provided from the master to each of the slave memory units. At step 120, upon receiving the number of total memory units provided from the master, and having previously counted the number of memory units to the end of the memory group, each slave memory unit can determine its precise location within the memory group.

Figure 2:
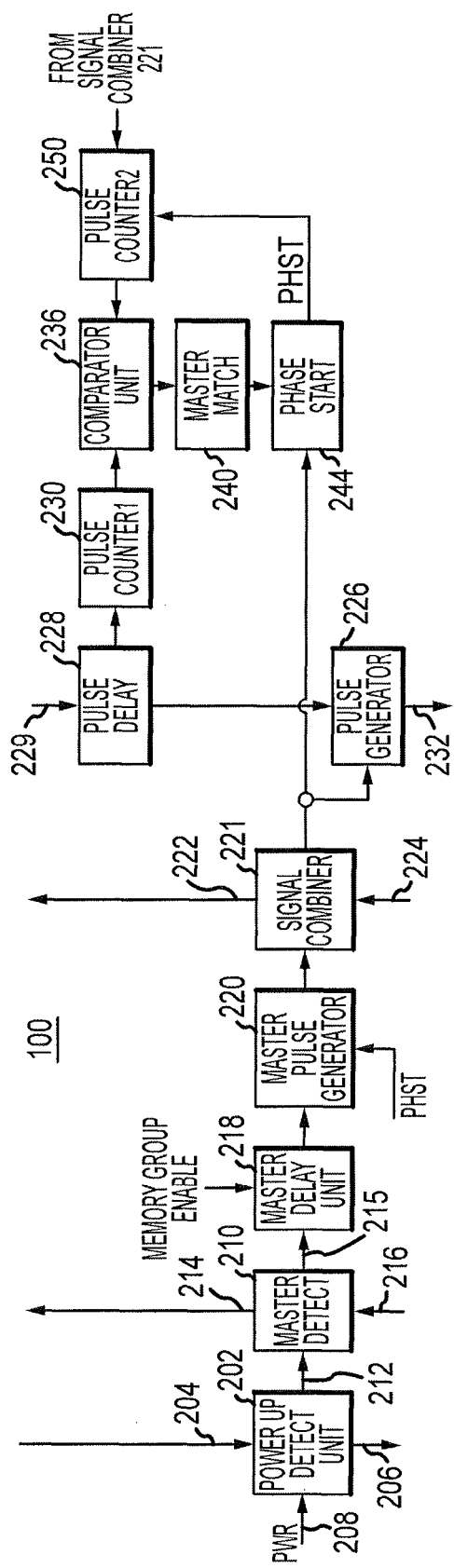
FIG. 2 is a block diagram of a master-slave detect circuit according to an embodiment of the invention.

FIG. 2 illustrates a block diagram of a master-slave detect circuit 100 according to an embodiment of the present invention. FIG. 2 will be described in reference to the steps and phases laid out above in FIG. 1B. In some embodiments, the master-slave detect circuit 100 shown may be identically reproduced in each memory unit in a memory group.

The master-slave detect circuit 100 may include a memory unit power-up detect unit 202, which may further include succeeding memory unit input 204 coupled to a succeeding memory unit in the memory group (if any), and preceding memory unit output 206 coupled to a preceding memory unit in the memory group (if any). If the master memory unit is the last memory unit in the memory group, power-up detect unit 202 may not receive any signal from succeeding memory unit input 204 if there are no succeeding memory units in the memory group. In FIG. 2, the succeeding memory unit input 204 of the illustrated memory unit may be coupled to the preceding memory unit output 206 of a preceding memory unit. Similarly, the preceding memory unit output 206 of the illustrated memory unit may also be coupled to the succeeding memory unit input of a preceding memory unit. However, for example, if a device is designated as a master memory unit and is at the bottom of a stack, there may be no preceding memory unit. There may also be no succeeding memory unit to a slave memory unit at the top of a stack. Power-up detect unit 202 may further receive power-up signal PWR on power-up input 208. The power-up detect unit 202 is coupled to master detect unit 210 via its power-up complete input 212. Master detect unit 210 may also include succeeding memory unit output 214 coupled to a succeeding memory unit of the memory group and preceding memory unit input 216 coupled to a preceding memory unit.

The master-slave detect circuit 100 further includes master delay unit 218 coupled to the master detect unit 210 and to master pulse generator 220. The master delay unit 218 and master pulse generator 220 are enabled for a master memory unit, as will be described in more detail below. A signal combiner 221 coupled to receive an output from the master pulse generator 220 is configured to provide over succeeding memory unit output 222 the signal provided from the master pulse generator 220 for the memory unit determined to be the master memory unit or from the preceding memory unit input 224 for other memory units in the memory group. The particular signal is further provided by the signal combiner 221 to pulse generator 226. The pulse generator 226 is coupled to a pulse delay 228, which receives pulses over succeeding memory unit input 229 (e.g., from a preceding memory unit) and adds delay before providing the same to the pulse generator 226. Responsive to the signal from the signal combiner 221, the pulse generator 226 generate a pulse which is provided on preceding memory unit output 232. The pulse generator 226 further provides pulses corresponding to the pulses it receives from the pulse delay 228. A first pulse counter 230 is coupled to the pulse delay and configured to count pulses received by the pulse delay 228 over the succeeding memory unit input 229.

Further included in the master-slave detection circuit 100 is a comparator unit 236 configured to compare pulse counts to determine a relative location for a memory unit in a memory group based at least in part on the pulses provided to it by the first pulse counter 230 and a second pulse counter 250. In some embodiments, the comparator unit includes subtraction logic that subtracts the count of the first pulse counter 230 from the count of the second pulse counter 250 and provide an output indicative of the difference. A master match circuit 240 is coupled to the comparator circuit 236, and responsive to the comparator unit 236 indicating a match between the counts of the first and second pulse counters 230, 250 (e.g., the comparator unit 236 provides a difference signal indicative of a zero difference between the counts) provides a disable signal to a phase start circuit 244. The phase start circuit 244 is configured to provide an enable signal PHST to the pulse counter 250 and the master pulse generator 220 to initiate the location calculation phase 103 responsive to the output from the signal combiner 221. The phase start circuit 244 is further configured to disable operation of the second pulse counter 250 and master pulse generator 220 responsive to the disable signal from the master match circuit 240.

Various components, inputs, and outputs included in the master-slave detection circuit 100 are used during both the relative location detect phase 102 and location calculation phase 103 previously described. For example, the master pulse generator 220 and signal combiner 221 are both used during the two phases, as well as the succeeding memory output 222 and preceding memory input 224. By using the components for both phases, fewer circuits are needed. Also, using the output 222 and the input 224 for multiple phases may reduce the number of connections needed between memory units of the memory group. This may be done in order to decrease use of space that would otherwise be needed to accommodate additional connections between the memory units and may also increase circuit efficiency.

In operation, during the master detect phase 101, an active PWR signal is provided over power-up input 208 to the power-up detect unit 202 of each respective memory unit. The PWR signal becomes active after a power-up sequence for a respective memory unit is completed. Because each memory unit powers up individually due to factors such as relative location of the memory unit in the memory group or the type of components used, each memory unit may have a slightly variable power-up time. When a particular memory unit is fully powered up the PWR signal is active for that particular memory unit. In some embodiments, an active signal may be a high logic level signal and an inactive sign may be a low logic level signal. The alternative logic levels may be used as well.

As mentioned above, power-up detect unit 202 may also receive an input from a succeeding memory unit coupled to succeeding memory unit input 204. If a succeeding memory unit is coupled to succeeding memory unit input 204, a signal may be provided to the power-up detect unit 202 which indicates that the succeeding memory unit (or units) in the memory group is also powered up. When both the PWR signal provided on power-up input 208 and the signal provided on succeeding memory unit input 204 are active signals, the power-up detect unit 202 provides an active signal to the master detect circuit 210 over power-up complete input 212, and further provides the active signal to a preceding memory unit via preceding memory unit output 206. If there are no succeeding memory units (for example, if the memory unit is the top die in a die stack), the succeeding memory unit input 204 may be coupled to a circuit that provides an active signal in the absence of a signal from a succeeding memory unit. For example, this may be done through the use of a n-channel device coupled to the input 204 and configured to weakly pull the state of input 204 active when the input 204 is not coupled to a successive memory unit. Responsive to both the PWR signal and the signal from a successive memory unit being active, the power-up detect unit 202 of each memory unit provides an active signal over preceding memory unit output 206 to a preceding memory unit until an active signal reaches the power-up detect unit 202 of a first memory unit, which may become the master memory unit as further explained below.

While the power-up sequence is underway, master detect unit 210 indicates the power-up is not yet complete, and provides a substantially continuous active signal to succeeding memory units over succeeding memory unit output 214. This active signal is received by the master detect unit 210 through preceding memory unit input 216. However, in the case of the first memory unit, it does not have any preceding memory units to send it an active signal. Consequently, the preceding memory unit input 216 of the master memory unit remains inactive throughout the power-up sequence.

As previously discussed, when a power-up detect unit 202 receives active signals over both power-up input 208 as well as succeeding memory unit input 204, the power-up is considered complete, and the power-up detect unit 202 provides an active signal to the master detect circuit 210. If the signal provided to a master detect unit 210 over the preceding memory unit input 216 is inactive at the time the master detect unit 210 receives an active power-up complete signal on the power-up complete input 212 (i.e., indicating completion of the power-up sequence), the memory unit having that master detect unit 210 is determined to be the master memory unit.

When the power-up complete signal is received, the master detect unit 210 of the now determined master memory unit may also store this information in order to indicate that power-up has occurred and that the master-detect sequence has been completed. This subsequently switches the signal provided over succeeding memory unit output 214 from active to inactive, which informs succeeding memory units that they are slave memory units and that the master memory unit has been detected. The master detect unit 210 of the master memory unit further provides an active master detected signal over master detected output 215 to the master delay unit 218 indicating that it is the master memory unit and that the master detect phase 101 is complete.

According to an embodiment of the invention, the relative location detect phase 102 begins when master delay unit 218 receives an active master detected signal over master detected output 215 from the master detect unit 210 of the master memory unit indicating that the master is detected and power-up is complete. The master delay unit 218 of only the master memory unit will receive an active master detected signal (on master detected output 215), while the master delay units 218 of any other memory units (i.e., slave memory units) of the memory group will receive inactive master detected signals. Consequently, the master delay units 218 of the slave memory units are not enabled.

Master delay unit 218 of the master memory unit may also receive a memory group enable signal on input 217, which indicates whether or not the memory unit is a single memory unit or is to be included within a memory group having multiple memory units. For example, the memory group enable signal may be inactive if there is only one memory unit, and active if there are multiple memory units. As a result, an active signal for memory group enable signal 217 may be used to enable the master-slave circuitry in the master-slave detect circuit 100 and an inactive memory group enable signal 217 may be used to disable the master-slave circuitry, such as when the memory is not used in a memory group. The memory group enable signal 217 may be set for each of the memory units as active or inactive during manufacture of the memory unit or a memory group.

Upon receiving an active master detected signal from the master detect unit 210 (and an active memory group enable signal 217, if present), master delay unit 218 provides a delay to the active signal from the master detect unit 210. The delay to the signal may provide stability in the system after power-up and completion of the master detect phase 101, and prior to commencing the relative location detect phase 102. In some embodiments, the memory group enable signal is indicative of both whether the memory unit is to be included within a memory group and a memory group size. The duration of the delay provided by the master delay unit 218 may be based at least in part on the memory group size, as indicated by the memory group enable signal. For example, the delay may be 25 nanoseconds for a memory group having four memory units, or may be 50 nanoseconds or longer for a memory group of eight or 16 memory units.

Master delay unit 218 provides the delayed signal to master pulse generator 220. Master pulse generator 220, which is enabled for the master memory unit, then generates a pulse. Because master pulse generator 220 is enabled only for the master memory unit, the master pulse generators 220 of the slave memory units will not generate pulses. The pulse width of the pulse provided by the master pulse generator 220 of the master memory unit may be similar to the delay generated by master delay unit 218, or may be of some different length. The relatively long pulse provided by the master pulse generator 220 may be used to set the time over which the relative location detect phase 102 is performed and to signal when the location calculation phase 103 should begin. The pulse generated by pulse generator 220 may then be provided to signal combiner 221. As previously discussed, the signal combiner 221 for the master memory unit provides over the succeeding output 222 a signal received from the master pulse generator 220 rather than from the preceding memory unit input 224. As a result, the signal combiner 221 for the master memory unit provides the pulse from the master pulse generator 220 to slave memory units coupled to succeeding memory unit output 222. The signal combiners 221 for the other memory units, however, provides over its respective succeeding memory unit output 222 the signal received from its respective preceding memory unit input 224 (e.g., the pulse from the master pulse generator 220 of the master memory unit).

The pulse from the master pulse generator 220 propagates to all of the slave memory units through their respective signal combiner 221. Each slave memory unit receives the pulse from master pulse generator 220 of the master memory unit via its preceding slave input 224, and generates its own pulse with their respective pulse generator 226 in response, as explained in more detail below.

Upon receiving the pulse from master pulse generator 220 of the master memory unit, each slave memory unit begins step 114 of the relative location detect phase 102 to count the number of succeeding memory units. In operation, each memory unit generates a pulse at its pulse generator 226 responsive to the pulse from the enabled master pulse generator 220 of the master memory unit. The pulses will be used to count the number of succeeding memory units. The pulse generated by a slave memory unit is provided to a preceding memory unit (if any) via preceding memory unit output 232. Each memory unit also receives a pulse from its succeeding memory unit in the memory group (if present) through succeeding memory unit input 229. However, if a memory unit is the last memory unit in the memory group (e.g. the top slave unit), no pulses are received via its succeeding memory unit input 229.

When pulses are received from a succeeding memory unit, the pulse delay unit 228 of a memory unit may delay the received pulse(s) before being provided to the pulse generator 226. The pulse generator 226 also provides pulses corresponding to the pulses it receives from the pulse delay unit 228 along with the pulse it generated to provide a pulse train to a preceding memory unit over preceding memory unit output 232. The pulses received by the pulse delay unit 228 may be delayed in order to separate and differentiate the received pulses from the pulse generated by the pulse generator 226 responsive to the pulse from the master pulse generator 220 of the master memory unit. Otherwise, multiple pulses could run together into a long pulse preventing reliable counting later on. The pulse delay may also further contribute to the stability and accuracy of the circuit in the event of signal corruption or loss.

In addition to providing received pulses to the pulse generator 226, the pulse delay further provides the received pulses to first pulse counter 230. Each distinct received pulse is counted by first pulse counter 230 at step 116. As a result, at the completion of the relative location detect phase 102 each of the first pulse counters 230 of the memory units includes a respective count representing the number of its respective succeeding memory units (resulting from the number of pulses it received). Consequently, each of the slave memory units have a count of the number of succeeding memory units, and where the master memory unit is a "first" memory unit in the memory group, the master memory unit has a count of the number of slave memory units (i.e., succeeding memory units) of the memory group.

The relative location detect phase 102 may end and memory unit location calculation phase 103 may be initiated responsive to the end of the pulse generated by the master pulse generator 220 of the master memory unit. During phase 103, the master memory unit provides the total number of slave memory units to each of the memory units in the memory group, which may be used by each of the memory units to determine their location in the memory group, as will be described in more detail below.

Phase start circuit 244 of the master memory unit enables the master pulse generator 220 to generate pulses and further enables its pulse counter 250 to count the generated pulses. The phase start circuits 244 of the slave memory units enables only their pulse counters 250. The enabled master pulse generator 220 of the master memory unit generates pulses which are provided to signal combiner 221 and propagated over succeeding memory output 222. The pulses output onto succeeding memory unit output 222 are counted by the respective second pulse counters 250 of the memory units. The respective comparator units 236 perform the comparison operation and provide, for example, a difference signal representing the difference between the counts of the respective first and second pulse counters 230, 250. At the completion of the location calculation phase 103 the difference signal will represent the memory unit's location within the memory group.

In each of the slave memory units coupled to the succeeding memory unit output 222, the pulses generated by the master pulse generator 220 of the master memory unit are counted by the respective second pulse counter 250. The second pulse counter 250 will contain a record of the total number of slave memory units due to the pulses from the master memory unit. As previously discussed, the respective first pulse counters 230 contain a record of the number of succeeding memory units. Thus, a memory unit's location may be determined from the difference between the counts of the first and second pulse counters 230, 250.

In the master memory unit, when the count of the second pulse counter 250 (i.e., the number of pulses provided by the master memory unit to the slave units during the location calculation phase 103) is equal to the count of the first pulse counter 230 (i.e., the number of slave memory units), its comparator unit 236 provides a difference signal of zero. In response, the master match circuit 240 provides a signal to control the phase start circuit 244 to disable the master pulse generator 220 from generating pulses. As a result, the master pulse generator 220 of the master memory unit stops generating any further pulses, thus completing the location calculation phase 103.

Figure 3A:
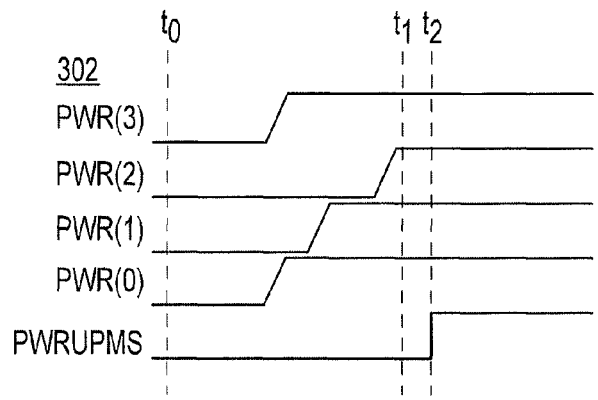
FIG. 3A is a timing diagram of the master detect phase step for a master-slave detect circuit according to an embodiment of the invention.
Figure 3B:
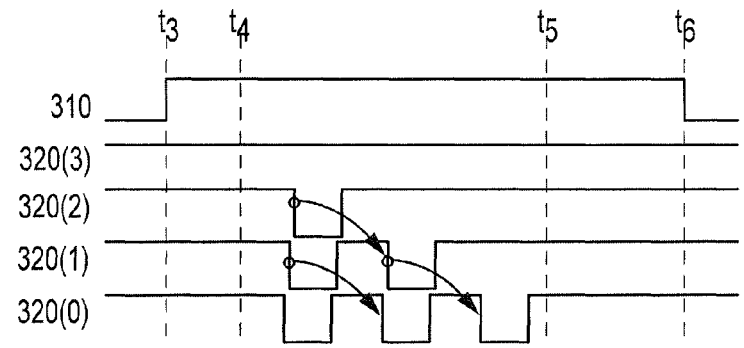
FIG. 3B is a timing diagram of relative location detect phase for a master-slave detect circuit according to an embodiment of the invention.
Figure 3C:
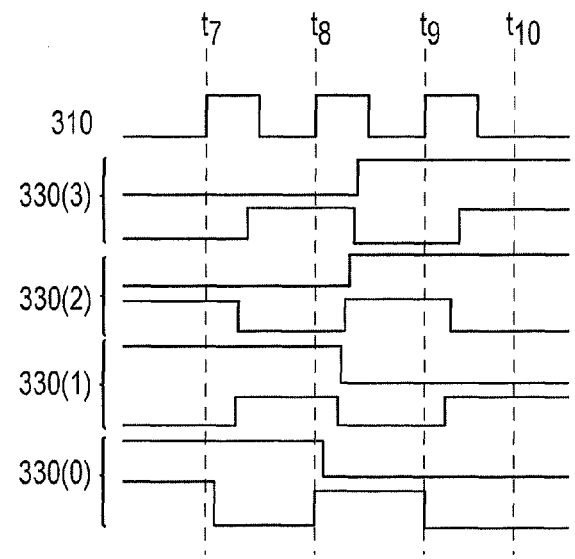
FIG. 3C is a timing diagram of the die location calculation phase for a master-slave detect circuit according to an embodiment of the invention.

The activity of the master-slave detect circuit 100 is further illustrated in FIGS. 3A, 3B, and 3C, which are timing diagrams for the circuit 100 for a memory group having four memory units (1 master memory unit, 3 slave units), according to an embodiment of the present invention.

FIG. 3A corresponds to a timing diagram of the master detect phase 101, and illustrates respective PWR signals PWR(0)-PWR(3) for the four memory units 0-3 and master detected signal PWRUPMS provided by master detect unit 210 over master detected output 215. As previously discussed, the PWR signal becomes active responsive to completion of the power-up sequence for a respective memory unit. The memory units may require different amounts of time to complete power-up, for example, due to variations in manufacturing processes or memory unit location in a memory group. This is observable in signals PWR(0)-PWR(3) as different times for the rising edges occurring between times t0 and t1.

At time t0, power (not shown in FIG. 3A) is provided to each of the memory units. Subsequent to t0, the respective power-up signals PWR(0)-PWR(3) become active after the respective power-up sequence has completed. By time t1, all units have completed the respective power-up sequences as represented by the PWR(0)-PWR(3) signals all being active (high). When power-up for all of the memory units is complete, the memory units generate respective power-up complete signals (not shown in FIG. 3A) and provide it to its master detect unit 210 to indicate the completion of the power-up sequence. As previously discussed, however, the memory unit having a master detect unit 210 receiving an inactive signal on preceding memory unit input 216 is determined to be the master memory unit. As a result, the master detect unit 210 of the master memory unit provides master detect circuit 210 of the memory unit determined to be the master memory unit provides an active PWRUPMS signal over the master detected output 215, which is observable at time t2, to its master delay unit 218.

FIG. 3B depicts a timing diagram of relative location detect phase 102 for a master-slave detect circuit according to an embodiment of the invention. A pulse signal 310 is provided by the master pulse generator 220 of the master memory unit after the master detect phase 101 is completed, as previously discussed. The pulse signal 310 becomes active at time t3 and remains active until time t6. The pulse signal 310 is provided to the slave memory units over the succeeding memory unit output 222 of the master memory unit. Responsive to the pulse signal 310, the pulse generators 226 of the memory units are enabled and generate respective pulses that are provided on preceding memory unit output 232. Additionally, the pulse generators 226 provides the pulses it receives from its respective pulse delay 228. The pulses provided by the pulse generators 226 of each of the memory units are illustrated as pulse signals 320(0)-320(3) between times t4 and t5.

The pulse signal 320(3), which represents the pulses provided by the pulse delay 228 of a last memory unit, does not include any pulses because it does not receive any pulses given that it is the last memory unit. This last memory unit, however, provides a pulse to a second to last memory unit on the preceding memory unit output 232 responsive to the active pulse signal 310. The pulse signal 320(2), which represents the output from the pulse delay 228 of the second to last memory unit, includes the pulse provided by the last memory unit. The pulse generator 226 of the second to last memory unit provides that pulse onto the preceding memory unit output 232, trailing the pulse it generated responsive to the pulse signal 310.

Pulse signal 320(1) represents the output from the pulse delay 228 for a third to last memory unit which receives the pulse signal 320(2). The first pulse of pulse signal 320(1) is generated by the pulse generator 226 of the third to last memory unit responsive to the active pulse signal 310, and the second pulse of pulse signal 320(1) corresponds to the pulse of pulse signal 320(2), provided with delay by the pulse delay 228 of the third to last memory unit. Finally, pulse signal 320(0) represents the output from the pulse delay 228 for the fourth to last (i.e., the master) memory unit. The pulse signal 320(0) includes three pulses, the first pulse was generated by the pulse generator 226 of the fourth to last memory unit responsive to the active pulse signal 310, the second pulse corresponds to the pulse generated by the pulse generator 226 of the second to last memory unit, and the third pulse corresponds to the pulse generated by the pulse generator 226 of the last memory unit.

The pulses provided by the pulse delay 228 are counted by respective pulse counters 230. The resulting count represents the number of succeeding memory units. For example, the single pulse of pulse signal 320(2) results in a count of 1, indicating that there is one succeeding memory unit to the second to last memory unit. The pulse signal 320(0) provided by the pulse delay 228 of the master memory unit includes three pulses, one for each succeeding slave memory unit. At time t5, the master memory unit has received all pulses from slave memory units, and at time t6 the pulse signal 310 become inactive and indicates the completion of the relative location detect phase 102. The inactive pulse signal 310 may further indicate the beginning of memory unit location calculation phase 103.

FIG. 3C illustrates a timing diagram of the memory unit location calculation phase 103 for a master-slave detect circuit according to an embodiment of the invention. FIG. 3C includes the pulse signal 310 and location count signals 330(0)-330(3) provided by calculation logic. The pulse signal 310 was previously discussed with reference to FIG. 3B and the relative location detect phase 102. The pulse signal 310 illustrated in FIG. 3C still represents the output from the master pulse generator 220, but during the location calculation phase. The location count signals 330(0)-330(3) represent the location of a respective memory unit in the memory group, which may be calculated from count values of the first and second pulse counters 230 and 250, as previously discussed.

The pulse signal 310, as previously discussed, is provided by the master pulse generator 220 of the master memory unit. The three pulses of pulse signal 310 (having rising edges at times t7 through t9) of FIG. 3C result from the master pulse generator 220 generating pulses responsive to being enabled by phase start circuit 244 of the master memory unit. The phase start circuit 244 may enable the master pulse generator 220 responsive to, for example, the inactive pulse signal 310 at time t6 of FIG. 3B. The pulses of pulse signal 310 are provided to the slave memory units through the signal combiner 221 of the master memory unit and over succeeding memory unit output 222. Three pulses are generated before the count of pulse counter 230 of the master memory unit is three and the comparator unit 236 provides a difference signal representing a zero difference to the master match circuit 240, which in turn controls the phase start circuit 244 to disable the master pulse generator 220 from further generating pulses. As a result, the master pulse generator 220 for the master memory unit generates only three pulses. The three pulses of pulse signal 310 represents the total number of slave memory units (i.e., three) in the memory group.

The three pulses are provided to the second pulse counters 230 of the master and slave memory units, which count the pulses. The count value of the respective second pulse counters 230 may then be used to determine the location of the memory unit in the memory group. The location count signals 330(0)-330(3) represent the output of the respective comparator unit 236. As shown for the embodiment of illustrated by FIG. 3C, 2-bit values are provided by the comparator units 236. Each bit is represented by a signal of the pair of location count signals 330(0)-330(3). Responsive to each pulse at times t7-t9, the respective location count changes, as illustrated by signal transitions of the location count signals 330(0)-330(3). At time t10, each of the location count signals 330(0)-330(3) is in its final state, thus indicating the relative location of each memory unit. For example, location count signal 330(3), representing the location count of a last memory unit, shows a reading of two high signals, thus indicating a relative location of "11" in binary, corresponding to a slave 3 memory unit. Location count signal 330(2), with a reading of "10" at time t10, corresponds to the location count for a slave 2 memory unit, and location count signal 330(1) with a reading of "01" at time t10 corresponds to the location count for a slave 1 memory unit. Location count signal 330(0), with a reading of "00" corresponds to the location count for the master memory unit.

Figure 4A:
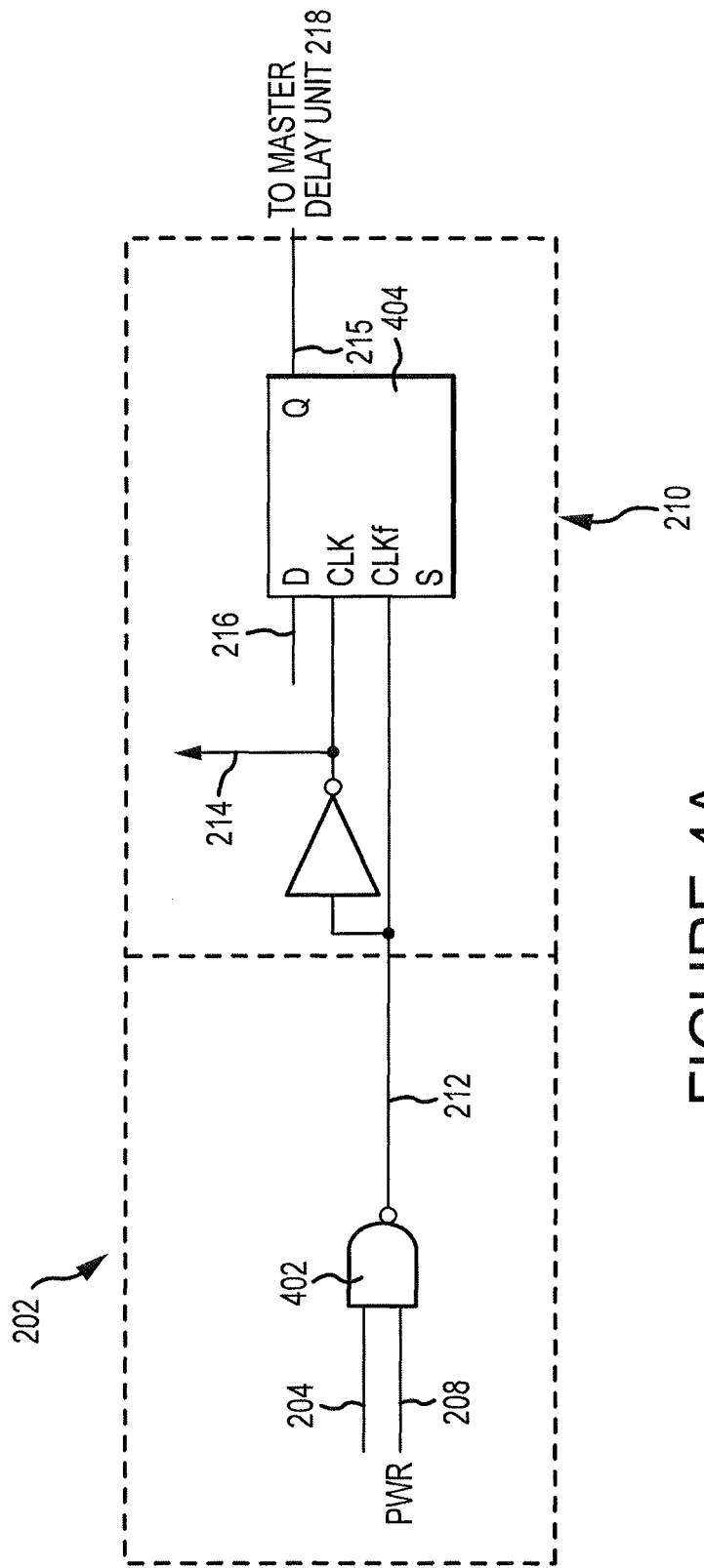
FIG. 4A is a schematic diagram of the master detect phase for a master-slave detect circuit according to an embodiment of the invention.

FIG. 4A illustrates power up detect unit 202 and master detect unit 210 according to an embodiment of the invention. Power-up detect unit 202 may be implemented with a NAND gate 402 which receives and combines the PWR signal from power-up input 208 and the signal from succeeding memory unit input 204. As described above, the output of the NAND 402 is provided to master detect unit 210 on the power-up complete input 212. As shown for the illustrated embodiment, master detect unit 210 is implemented by a D flip flop 404. The D flip flop 404 stores a state of the power-up complete signal from input 212 and switches succeeding memory unit output 214 from active to inactive accordingly. The D flip flop 404 is further coupled to the preceding memory unit input 216. As previously discussed, switching of succeeding memory unit output 214 (i.e., switching of preceding memory unit input 216 of a preceding memory unit) from active to inactive informs the succeeding memory units that they are slave memory units and that the master has been detected. The D flip flop 404 provides an active master detected signal over master detected output 215 for the master memory unit, and provides an inactive master detected signal for slave memory units. While master detect unit 210 is implemented with a flip flop, other storage mechanisms are possible, such as a shift register.

Figure 4B:
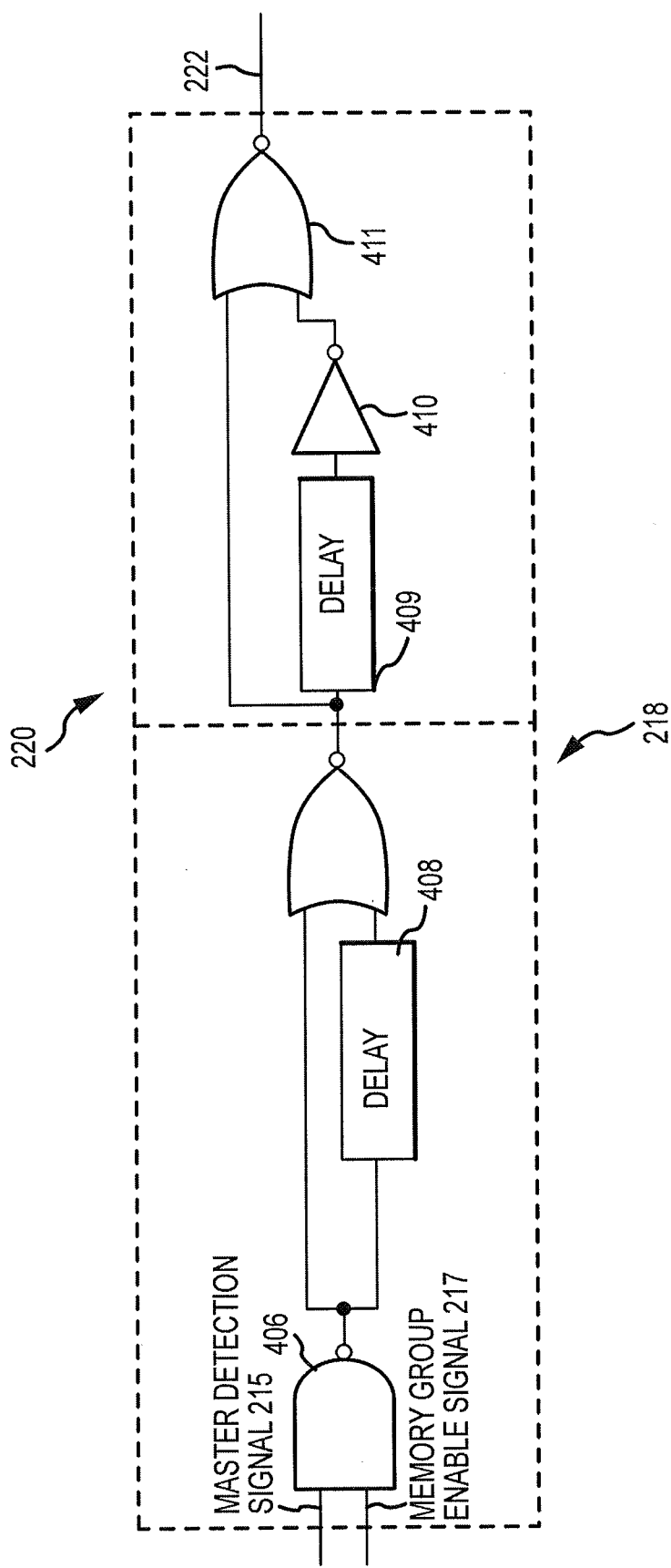
FIG. 4B is a schematic diagram of the first portion of a relative location detect phase for a master-slave detect circuit according to an embodiment of the invention.

FIG. 4B illustrates a master delay unit 218 and master pulse generator 220 according to an embodiment of the invention. In the illustrated embodiment, master delay unit 218 is implemented with a NAND gate 406, and has a first input 215 to which the master detected signal from the master detect unit 210 is provided and has a second input 217 to which memory group enable signal may be provided. As previously discussed, the master detected signal is active when the current memory unit is detected as the master memory unit. As shown, master delay unit 218 may further include a delay unit 408 (e.g., 25 nanosecond) in order to delay the incoming signal before providing it to pulse generator 220. The master pulse generator 220 includes a delay unit 409, inverter 410, and NOR gate 411. The master pulse generator 220 is configured to provide a pulse having a pulse width approximately equal to the delay of the delay unit 409. The circuit implementation of the master pulse generator 220 is similar to that of the delay unit 218, but instead it generates a pulse having a pulse width based in part on the delay 409 rather than providing a delay based in part on the delay 408 before providing an output signal.

Figure 4C:
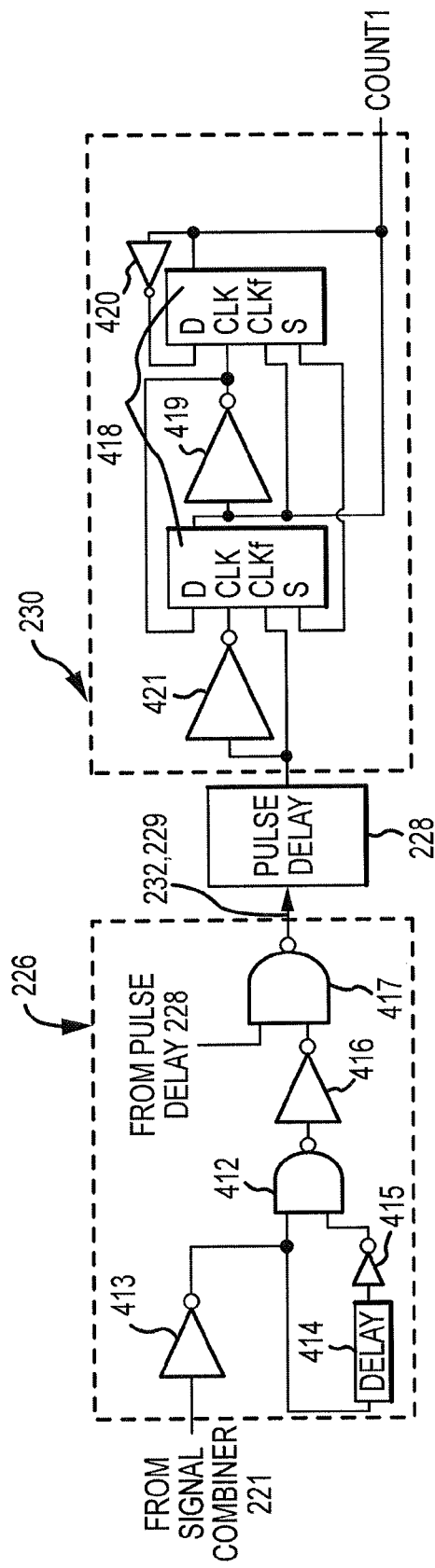
FIG. 4C is a schematic diagram of the second portion of a relative location detect phase for a master-slave detect circuit according to an embodiment of the invention.

FIG. 4C illustrates the pulse delay unit 228 and first pulse counter 230 of a particular memory unit, and the pulse generator 226 of a succeeding memory unit according to an embodiment of the invention. Pulse generator 226 includes inverters 413, 415, and 416, and further includes delay 414 and NAND gates 412 and 417. In response to receiving a signal from the signal combiner 221 (e.g., provided from master pulse generator 220 of the master memory unit), the NAND gate 412 provides a pulse having a pulse width approximately equal to a total delay of the delay 414 and inverter 415. The pulse is provided by NAND gate 417 onto preceding memory unit output 232. Pulses received the pulse generator 226 are provided through NAND gate 417 onto the preceding memory unit output 232 as well. In some embodiments, the pulse generator 226 generates pulses responsive to received pulses from succeeding memory unit input. In other embodiments, the pulse generator 226 may provide a pass through for the received pulses from the succeeding memory unit input.

Each pulse generated by pulse generator 226, along with pulses received from pulse delay 228, may then be provided to the pulse delay unit 228 of the preceding memory unit via preceding memory unit output 232 (which is coupled to the succeeding memory unit input 229 of the particular memory unit). After the particular memory unit receives the pulses from pulse generator 226 of the succeeding memory unit, the pulses are then counted by the first pulse counter 230. The first pulse counter 230 includes two D flip flops 418 and inverters 419, 420, and 421. The D flip-flops 418 are toggled by the pulses provided from the pulse delay 228 and provide a two-bit count COUNT1. This counter may be implemented by other means, such as a shift register. Also, with memory groups having more than four memory units, a larger counter may be used.

Figure 4D:
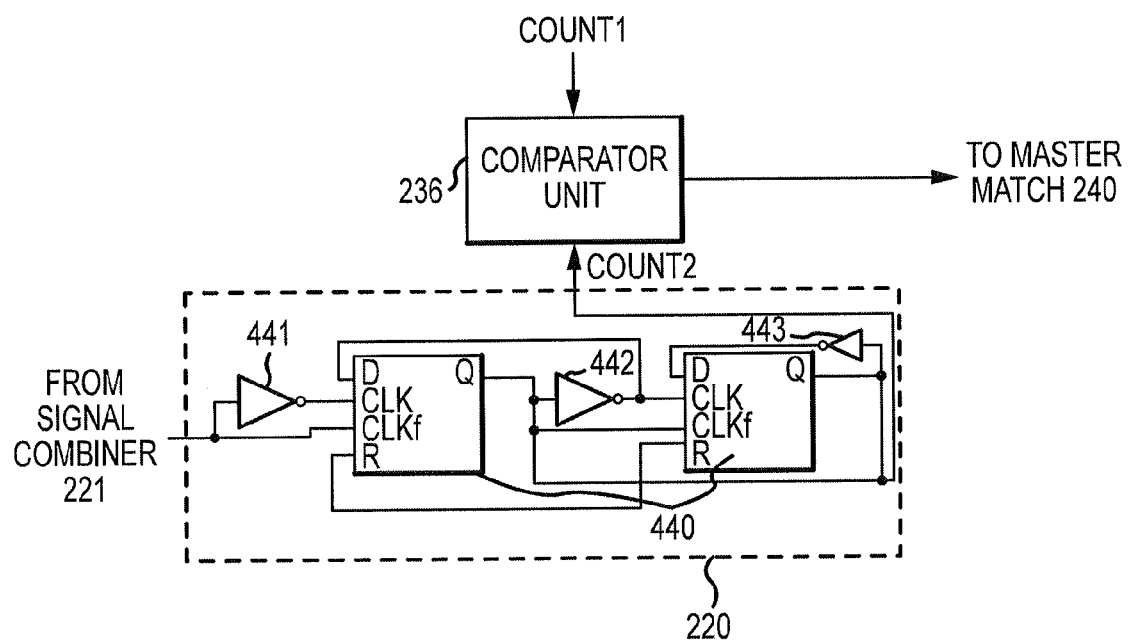
FIG. 4D is a schematic diagram of the die location calculation phase for a master-slave detect circuit according to an embodiment of the invention.

FIG. 4D illustrates a comparator unit 236 and second pulse counter 250 according to an embodiment of the invention. The comparator unit 236 may be implemented by subtraction logic that performs a subtraction operation between the counts COUNT1, COUNT2 of the first and second pulse counters 230, 250. The second pulse counter 220 includes two D flip flops 440 and inverters 441, 442, 443. The D flip-flops 440 are toggled by the pulses provided from the signal combiner 221 of the master memory unit to provide a two-bit count COUNT2. The resulting output from the comparator unit 236 is provided to the master match circuit 240. The output may represent a difference of the COUNT1 and COUNT2 counts. As previously discussed, in the master memory unit the output from the comparator unit 236 will eventually be a zero count, in response to which the master match circuit 240 controls the phase start circuit 244 to disable the master pulse generator 220 from further generating pulses.

As illustrated by the previous examples, embodiments of circuit 100 may be implemented for memory groups having several memory units. Identical memory units may be used together in a master-slave configuration without the need to separately manufacture each memory unit in order to hard-code location information. Additionally, for some embodiments the master-slave detect circuit performs its operation early, for example, during initialization of the memory units of the memory group rather than waiting until after the entire memory group is fully operational. As a result, quicker overall initialization and operational capacity may be provided. According to some embodiments of the present invention, the master-slave detect circuit 100 may also be scalable to larger memory groups while using substantially the same circuitry. For example, memory groups having 8, 16, and 32 memory units may be implemented, and so on. The circuit 100 may utilize four inter-memory unit signals between each preceding and succeeding memory unit in order to operate, including two signals for phase 101 and two signals for phase 102. For example, one slave memory unit having both a preceding master memory unit and a succeeding slave memory unit may have 4 signals to communicate with the master memory unit, as well as 4 signals to communicate with the slave memory unit. In order to reduce manufacturing burden and to increase space efficiency, phase 103 may use the same inter-memory signal connections as in phase 102 rather than adding a fifth connection. Conventional static schemes for die integration, such as through-silicon via (TSV), may be proportionally very large compared to average die size, and a reduction in TSV interconnections provides a significant die size reduction benefit. Additionally, a very large number of TSV interconnections can potentially fracture delicate dies.

Figure 5:
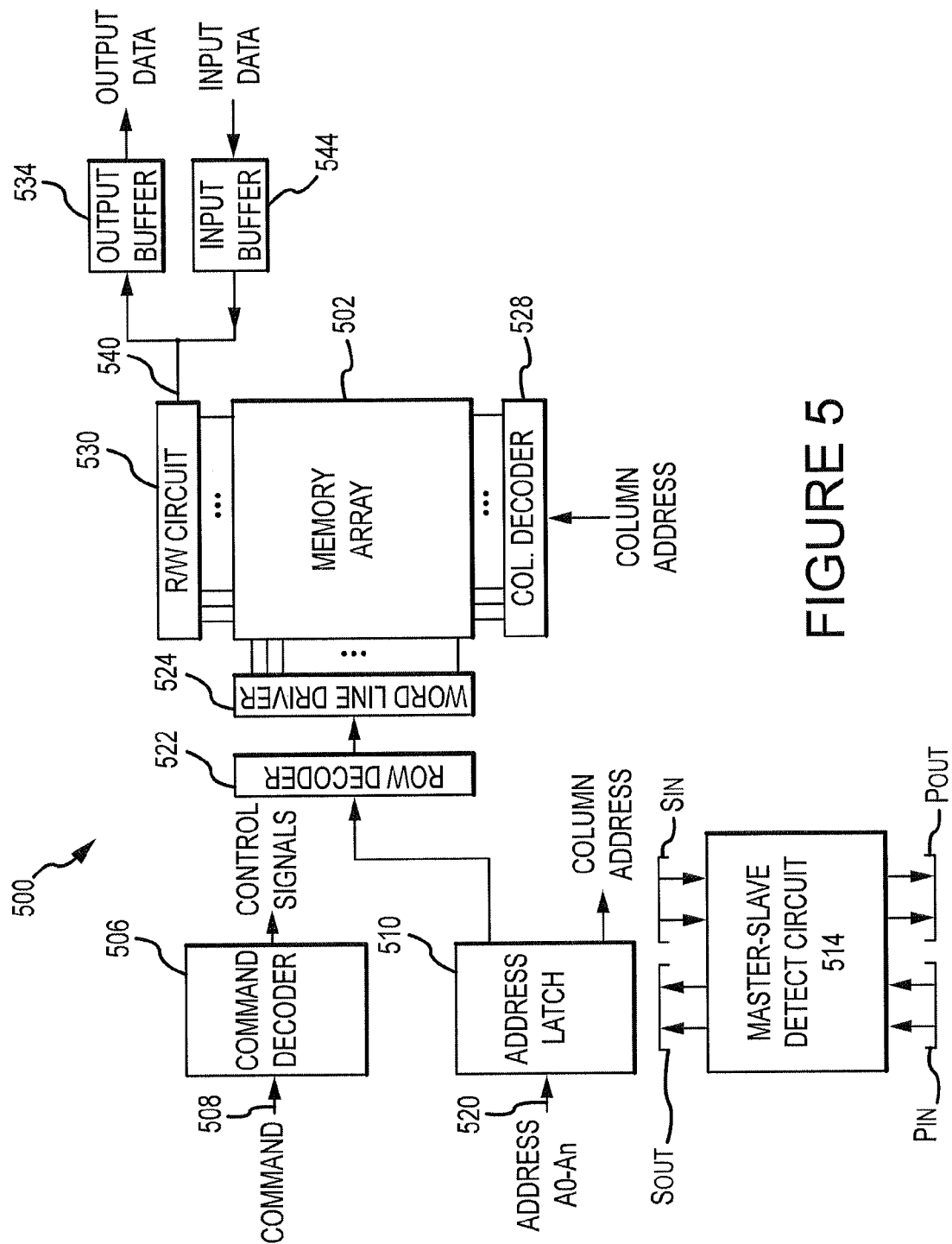
FIG. 5 is a block diagram of a portion of a memory unit having a master-slave detect circuit according to an embodiment of the present invention

FIG. 5 illustrates a portion of a memory unit 500 having a master-slave detect circuit 514 according to an embodiment of the present invention. The memory unit 500 includes an array 502 of memory cells, which may be, for example, DRAM memory cells, SRAM memory cells, flash memory cells, or some other types of memory cells. The memory unit 500 includes a command decoder 506 that receives memory commands through a command bus 508 and generates corresponding control signals within the memory unit 500 to carry out various memory operations. Row and column address signals are applied to the memory unit 500 through an address bus 520 and provided to an address latch 510. The address latch then outputs a separate column address and a separate row address.

The row and column addresses are provided by the address latch 510 to a row address decoder 522 and a column address decoder 528, respectively. The column address decoder 528 selects bit lines extending through the array 502 corresponding to respective column addresses. The row address decoder 522 is connected to word line driver 524 that activates respective rows of memory cells in the array 502 corresponding to received row addresses. The selected data line (e.g., a bit line or bit lines) corresponding to a received column address are coupled to a read/write circuitry 530 to provide read data to a data output buffer 534 via an input-output data bus 540. Write data are applied to the memory array 502 through a data input buffer 544 and the memory array read/write circuitry 530. The command decoder 506 responds to memory commands applied to the command bus 508 to perform various operations on the memory array 502. In particular, the command decoder 506 is used to generate internal control signals to read data from and write data to the memory array 502.

A master-slave detect circuit 514 according to the embodiment receives signals SIN provided to succeeding memory unit inputs and signals PIN provided to preceding memory unit inputs, and further provides signals SOUT from succeeding memory unit outputs and signals POUT from preceding memory unit outputs. As previously discussed, the master-slave detect circuit 514 may be utilized to determine whether the memory unit 500 is in the role of a master or slave unit, and if in the role of a slave unit, its relative location to the other slave units, if any.

Figure 6:
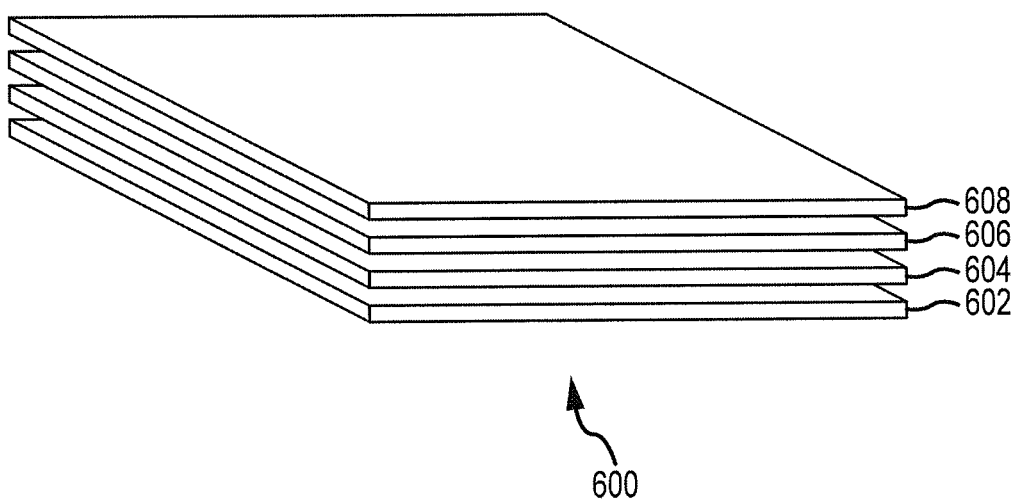
FIG. 6 is an illustration of a memory group according to an embodiment of the invention.

FIG. 6 illustrates a memory group 600 according to an embodiment of the invention. In the embodiment shown, a 4-high memory unit stack is illustrated, each memory unit having the master-slave detect circuit according to an embodiment of the present invention. In the embodiment shown, the bottom memory unit may be designated as the master memory unit 602, with a first slave 604, second slave 606, and third slave 608 stacked vertically on top of it. As discussed above, memory groups according to embodiments of the present invention may be stacked in configurations 8-high, 16-high, 32-high, and so on. In some configurations the memory units may be stacked directly on top of one another, while in others, they may be offset.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus, comprising:
a first pulse generator coupled to a succeeding memory unit input and coupled to a preceding memory unit output, the first pulse generator configured to generate a pulse and further configured to provide the generated pulse and pulses provided to the succeeding memory unit to the preceding memory unit output;
a first pulse counter coupled to the succeeding memory unit input and configured to count pulses provided to the succeeding memory unit input to provide a first count;
a second pulse generator configured to generate pulses when enabled;
a second pulse counter coupled to a preceding memory unit input and the second pulse generator, the second pulse counter configured to count pulses provided by the second pulse generator or count pulses provided to the preceding memory unit input to provide a second count; and
a comparator unit coupled to the first and second pulse counters and configured to compare the first and second counts and provide a location count signal based at least in part on the comparison, the location count signal indicative of a location to the memory unit in a memory group.

2. The apparatus of claim 1 wherein the first and second pulse counters are binary counters.

3. The apparatus of claim 1 wherein the first counter comprises:
a plurality of flip flops toggled by the pulses provided to the succeeding memory unit input.

4. The apparatus of claim 1 wherein the pulse generator is configured to generate pulses responsive to the pulses received from the succeeding memory unit input to a preceding memory unit output.

5. The apparatus of claim 1, further comprising:
a pulse delay coupled to the succeeding memory unit input and the pulse generator, the pulse delay configured to delay pulses provided to the succeeding memory unit input and provide the delayed pulses to the pulse generator.

6. A master-slave detect circuit, comprising:
a master detect unit having a power-up complete input and preceding memory unit input, the master detect unit configured to receive a power-up complete input indicative of completion of power-up and further configured to provide an active master detected signal responsive to an inactive signal provided to the preceding memory unit input when completion of power-up is indicated;
a master pulse generator coupled to the master detect unit and configured to be enabled by an active master detected signal, the master pulse generator further configured to generate a first pulse;
a pulse generator coupled to the master pulse generator, and coupled to a succeeding memory unit input and a preceding memory unit output, the pulse generator configured to generate a second pulse responsive to an active first pulse and further configured to provide the second pulse and pulses provided to the succeeding memory unit input to a preceding memory unit output;
a first pulse counter configured to count pulses provided to the succeeding memory unit input and provide a first count;
a second pulse counter configured to count pulses when enabled and provide a second count, the second pulse counter coupled to the master pulse generator to receive pulses generated thereby;
a phase start circuit coupled to the master pulse generator and configured to enable the master pulse generator to generate a plurality of pulses and to enable the second pulse counter to count the plurality of pulses generated by the master pulse generator, the phase start circuit configured to enable the master pulse generator and the second pulse counter responsive to an inactive first pulse;
a comparator unit coupled the first and second pulse counters and configured to provide a difference signal indicative of a difference between the first and second counts; and
a master match circuit coupled to the comparator unit and further coupled to the phase start circuit, the master match circuit configured to control the phase start circuit to disable the master pulse generator from generating pulses responsive to the difference signal indicative of a zero difference between the first and second counts.

7. The master-slave detect circuit of claim 6, further comprising:
a master delay unit coupled to the master detect unit and the master pulse generator, the master delay unit configured to delay the active master detected signal before being provided to the master pulse generator.

8. The master-slave detect circuit of claim 7 wherein the master delay unit is further configured to be provided a memory group enable signal indicative of use of a memory unit in which the master-slave detect circuit is included.

9. The master-slave detect circuit of claim 6, further comprising:
a power up detect unit coupled to a succeeding memory unit power input and coupled to a preceding memory unit power output, and further coupled to the master detect unit, the power up detect unit configured to provide the power-up complete input indicative of completion of power-up responsive to an active power-up signal and an active signal provided to the succeeding memory unit power input.

10. The master-slave detect circuit of claim 6, further comprising:
a signal combiner coupled to the master pulse generator and further coupled to a succeeding memory unit output and a preceding memory unit input, the signal combiner configured to provide to the succeeding memory unit output the first pulse from the master pulse generator or a signal provided to the preceding memory unit input.

11. The master-slave detect circuit of claim 6 wherein the master pulse generator is configured to generate the first pulse having a pulse width greater than the sum total time of the plurality of pulses generated by the master pulse generator when enabled by the phase start circuit.

12. The master-slave detect circuit of claim 11 wherein the pulse width of the first pulse is substantially equal to a delay for providing the active master detected signal to the master pulse generator.

13. The master-slave detect circuit of claim 6 wherein the phase start circuit is configured to enable the master pulse generator to generate a plurality of pulses responsive to a falling edge of the first pulse.

14. A memory, comprising:
a plurality of interconnected memory units, each memory unit comprising:
a first pulse generator coupled to a succeeding memory unit input and coupled to a preceding memory unit output, the first pulse generator configured to generate a pulse and further configured to provide the generated pulse and pulses provided to the succeeding memory unit to the preceding memory unit output;
a first pulse counter coupled to the succeeding memory unit input and configured to count pulses provided to the succeeding memory unit input to provide a first count;
a second pulse generator configured to generate pulses when enabled;
a second pulse counter coupled to a preceding memory unit input and the second pulse generator, the second pulse counter configured to count pulses provided by the second pulse generator or count pulses provided to the preceding memory unit input to provide a second count; and
a comparator unit coupled to the first and second pulse counters and configured to compare the first and second counts and provide a location count signal based at least in part on the comparison, the signal location count signal indicative of a location to the memory unit in the plurality of interconnected memory units.

15. A method for determining a location of a memory unit in a memory group having an arrangement of a plurality of memory units, the method comprising:
determining a master memory unit of the plurality of memory units;
receiving at each memory unit a signal indicative of a number of succeeding memory units of the receiving memory unit;
at the master memory unit, generating a signal indicative of a total number of memory units in the memory group other than the master memory unit;
providing the signal indicative of the total number of memory units in the memory group other than the master memory unit to the other memory units of the memory group; and
at each memory unit, comparing the total number of memory units in the memory group and the number of succeeding memory units of the respective memory unit to determine a respective location.

16. The method of claim 15 wherein comparing the total number of memory units in the memory group and the number of succeeding memory units comprises calculating a difference between the total number of memory units in the memory group and the number of succeeding memory units of the respective memory unit, the calculated difference indicative of the location of the respective memory unit.

17. The method of claim 15 wherein generating a signal indicative of a total number of memory units in the memory group other than the master memory unit comprises generating a signal having a number of pulses indicative of the total number of memory units in the memory group other than the master memory unit.

18. The method of claim 15 wherein generating a signal indicative of a total number of memory units in the memory group other than the master memory unit comprises generating a plurality of pulses until the plurality of pulses equals the number of succeeding memory units of the master memory unit.

19. The method of claim 18, further comprising counting the plurality of generated pulses.

20. The method of claim 15 wherein determining a master memory unit of the plurality of memory units comprises receiving at each memory unit a respective signal on a respective preceding memory unit input at the completion of a power-up sequence, wherein one of the memory units receives an inactive signal on the respective preceding memory unit input, the memory unit receiving the inactive signal determined to be the master memory unit.

21. A method for determining a location of a memory unit in a memory group having a plurality of memory units, the method comprising:
performing a master detect phase during which a memory unit in a memory group is determined to be a master memory unit;
determining at each memory unit its location relative to other memory units; and
determining at each memory unit its location in the memory group based on a total number of slave memory units and its location relative to other memory units.

22. The method of claim 21 wherein determining at each memory unit its location relative to other memory units comprises receiving at each memory unit a signal indicative of a number of succeeding memory units of the receiving memory unit.

23. The method of claim 22 wherein receiving at each memory unit a signal indicative of a number of succeeding memory units comprises receiving at each memory unit a signal having a number of pulses indicative of the number of succeeding memory units of the receiving memory unit.

24. The method of claim 23, further comprising:
   at each memory unit, counting the number of pulses of the respective signal it receives.

25. The method of claim 21, further comprising:
   at each memory unit other than the master memory unit, providing to a preceding memory unit a signal indicative of a number of succeeding memory units of the memory unit and the memory unit itself.

26. The method of claim 25 wherein providing to a preceding memory unit a signal indicative of a number of succeeding memory units of the memory unit and the memory unit itself comprises:
   generating a pulse at the memory unit itself and providing the pulse to the preceding memory unit; and
   providing a signal corresponding to the received signal the memory unit received that is indicative of a number of succeeding memory units of the receiving memory unit and providing the same to the preceding memory unit.

\* \* \* \* \*